United States Patent
Shirahige et al.

(10) Patent No.: US 12,364,025 B2
(45) Date of Patent: Jul. 15, 2025

(54) BACKSIDE PROTECTIVE SHEET FOR SOLAR CELL MODULES AND SOLAR CELL MODULE

(71) Applicant: DAI NIPPON PRINTING CO., LTD., Tokyo-to (JP)

(72) Inventors: Yasushi Shirahige, Tokyo-to (JP); Yuji Matsumoto, Tokyo-to (JP); Keita Arihara, Tokyo-to (JP); Atsushi Nakahara, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 363 days.

(21) Appl. No.: 17/606,677

(22) PCT Filed: Apr. 24, 2020

(86) PCT No.: PCT/JP2020/017646
§ 371 (c)(1),
(2) Date: Oct. 26, 2021

(87) PCT Pub. No.: WO2020/218485
PCT Pub. Date: Oct. 29, 2020

(65) Prior Publication Data
US 2022/0165897 A1 May 26, 2022

(30) Foreign Application Priority Data

Apr. 26, 2019 (JP) .................................. 2019-086347
May 20, 2019 (JP) .................................. 2019-094722

(51) Int. Cl.
*H10F 19/85* (2025.01)

(52) U.S. Cl.
CPC .................................. *H10F 19/85* (2025.01)

(58) Field of Classification Search
CPC ..... H01L 31/049; H01L 31/056; H10F 19/85; H10F 19/804; B32B 27/08; B32B 27/20; B32B 7/12; B32B 2307/4026; B32B 2307/414; B32B 2307/416; B32B 2457/12
See application file for complete search history.

(56) References Cited

FOREIGN PATENT DOCUMENTS

| JP | 2010-177386 A | 8/2010 | |
|---|---|---|---|
| JP | 2012-216689 A | 11/2012 | |
| JP | 2013-63659 A | 4/2013 | |
| JP | 2013-93410 A | 5/2013 | |
| JP | 5614360 B2 | 10/2014 | |
| WO | WO-2010087086 A1 * | 8/2010 | ............. B32B 27/08 |
| WO | WO-2012049193 A1 * | 4/2012 | ............. B32B 27/08 |

(Continued)

OTHER PUBLICATIONS

English machine translation of WO-2010087086-A1 (Year: 2024).*

(Continued)

*Primary Examiner* — Angelo Trivisonno
(74) *Attorney, Agent, or Firm* — Oliff PLC

(57) ABSTRACT

A backside protective sheet for solar cell modules includes a first layer configured to reflect near-infrared light, a first colored layer arranged closer to a light-receiving surface than the first layer and configured to transmit near-infrared light, and a second colored layer arranged closer to the light-receiving surface than the first colored layer and configured to transmit near-infrared light.

5 Claims, 4 Drawing Sheets

(56) References Cited

FOREIGN PATENT DOCUMENTS

WO      WO-2016043335 A1 * 3/2016 ............. B32B 27/20

OTHER PUBLICATIONS

English machine translation of WO-2016043335-A1 (Year: 2016).*
May 22, 2023 Search Report issued in European Patent Application No. 20794470.3.
Jul. 12, 2019 Office Action issued in Japanese Patent Application No. 2019-094722.
Sep. 6, 2019 Office Action issued in Japanese Patent Application No. 2019-086347.
Aug. 4, 2020 Search Report issued in International Patent Application No. PCT/JP2020/017646.
Sep. 28, 2021 International Preliminary Report on Patentability issued in International Patent Application No. PCT/JP2020/017646.
Dec. 6, 2022 Office Action issued in Japanese Patent Application No. 2019-219733.

* cited by examiner

BACKSIDE PROTECTIVE SHEET FOR SOLAR CELL MODULES AND SOLAR CELL MODULE

TECHNICAL FIELD

The present disclosure relates a backside protective sheet for solar cell modules and a solar cell module.

BACKGROUND ART

Attention has been focused in recent years on the use of solar batteries as clean energy sources with increasing awareness of environmental issues. A solar cell module, which constitutes solar batteries, commonly includes a transparent frontside substrate, an encapsulant, a solar cell element, an encapsulant, and a backside protective sheet, which are stacked on top of one another in order closest to the light-receiving surface. A solar cell module generates electric power upon the solar cell element being irradiated with sunlight.

The backside protective sheet used for producing solar cell modules may be required to have a black appearance in consideration of graphical design function. A possible approach to producing a backside protective sheet having a black appearance is to use an ink containing carbon black. However, since carbon black absorbs near-infrared light included in sunlight, the temperature of the solar cell module is increased disadvantageously during use. This reduces the power generation efficiency of the solar cell module. Therefore, it is not always preferable to use a backside protective sheet including carbon black for producing solar cell modules.

The present disclosure provides a backside protective sheet for solar cell modules and a solar cell module that reduce the occurrence of color unevenness and appear black at a sufficiently high density.

SUMMARY OF INVENTION

A backside protective sheet for solar cell modules according to the embodiment is a backside protective sheet for solar cell modules which includes a first layer configured to reflect near-infrared light; a first colored layer arranged closer to a light-receiving surface than the first layer, the first colored layer being configured to transmit near-infrared light; and a second colored layer arranged closer to the light-receiving surface than the first colored layer, the second colored layer being configured to transmit near-infrared light.

The backside protective sheet for solar cell modules according to the embodiment may further include a second layer interposed between the first colored layer and the second colored layer, the second layer being configured to transmit near-infrared light and visible light.

In the backside protective sheet for solar cell modules according to the embodiment, the second layer may have a haze value of 4% or more and 10% or less.

The backside protective sheet for solar cell modules according to the embodiment may further include a third layer arranged closer to the light-receiving surface than the second colored layer, the third layer being configured to transmit near-infrared light and visible light.

In the backside protective sheet for solar cell modules according to the embodiment, at least one of the first colored layer and the second colored layer may be a colored adhesive layer.

In the backside protective sheet for solar cell modules according to the embodiment, at least one of the first colored layer and the second colored layer may include a perylene color pigment.

In the backside protective sheet for solar cell modules according to the embodiment, at least one of the first colored layer and the second colored layer may include a color pigment such that a content of the pigment in the at least one of the first colored layer and the second colored layer is 5% by mass or more and less than 10% by mass.

A solar cell module according to the embodiment includes the above-described backside protective sheet for solar cell modules according to the embodiment.

According to the embodiment, the occurrence of color unevenness can be reduced and a sufficiently high density of black can be achieved.

A backside protective sheet for solar cell modules according to the embodiment is a backside protective sheet for solar cell modules which includes a first layer configured to reflect near-infrared light; a second layer arranged closer to a light-receiving surface than the first layer, the second layer being configured to transmit near-infrared light and visible light; a third layer arranged closer to the light-receiving surface than the second layer, the third layer being configured to transmit near-infrared light and visible light; and a colored layer interposed between the first layer and the second layer or between the second layer and the third layer, the colored layer including a perylene pigment, the colored layer being configured to transmit near-infrared light.

In the backside protective sheet for solar cell modules according to the embodiment, the colored layer may be a colored adhesive layer.

In the backside protective sheet for solar cell modules according to the embodiment, the colored layer may be interposed between the second layer and the third layer, and the backside protective sheet may further include a fourth layer interposed between the first layer and the second layer, the fourth layer being configured to transmit near-infrared light and visible light.

In the backside protective sheet for solar cell modules according to the embodiment, the colored layer may be interposed between the first layer and the second layer, and the backside protective sheet may further include a fourth layer interposed between the second layer and the third layer, the fourth layer being configured to transmit near-infrared light and visible light.

In the backside protective sheet for solar cell modules according to the embodiment, the fourth layer may be a transparent adhesive layer.

In the backside protective sheet for solar cell modules according to the embodiment, the colored layer may be interposed between the second layer and the third layer, and the backside protective sheet may further include an additional colored layer interposed between the first layer and the second layer, the additional colored layer being configured to transmit near-infrared light.

In the backside protective sheet for solar cell modules according to the embodiment, the additional colored layer may be a colored adhesive layer.

A solar cell module according to the embodiment includes the above-described backside protective sheet for solar cell modules according to the embodiment.

According to the embodiment, the negative impacts of migration can be reduced.

DESCRIPTION OF EMBODIMENTS

Figure 1:
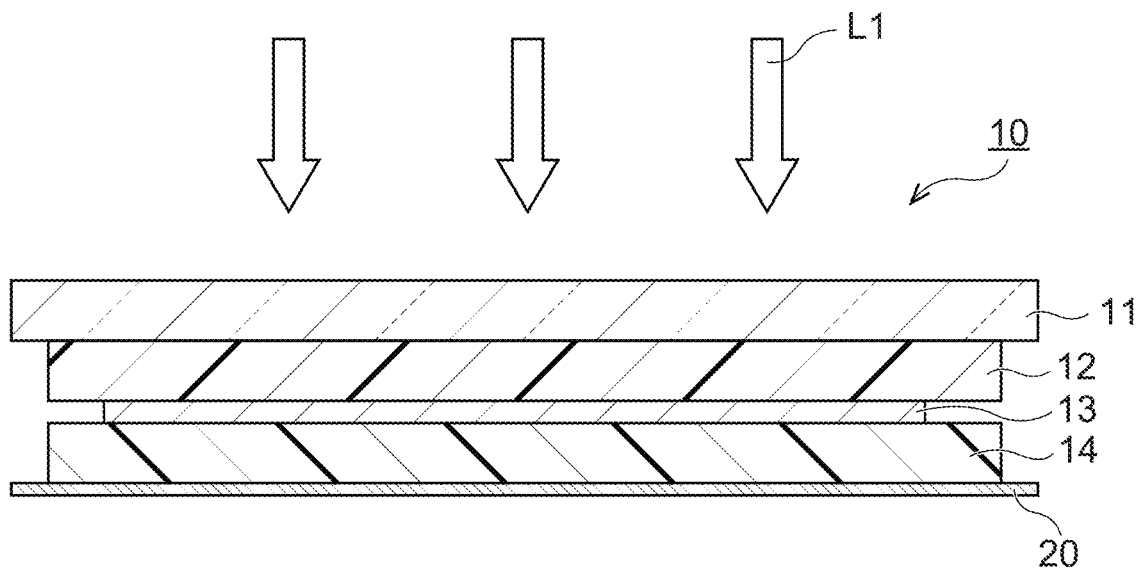
FIG. 1 is a schematic sectional view of a solar cell module according to a first embodiment, illustrating the structure of the layers constituting the solar cell module.

Each of the embodiments is described specifically with reference to the attached drawings below. Note that the drawings are schematic and the sizes and shapes of the members are exaggerated appropriately for ease of comprehension. Various modifications and changes may be made appropriately without departing from the technical scope of the present invention. In the drawings, the same members are denoted with the same reference numeral, and the detailed description thereof may be omitted partially. The values, such as dimensions, of each of the members described herein and the materials for the member are merely illustrative and not restrictive in the embodiment. The members may be selected appropriately. The terms used herein for specifying shape and geometric conditions, such as "parallel", "orthogonal", and "perpendicular" each refer to not only the exact meaning of the term but also the state that is substantially equivalent to the meaning of the term.

Figure 2:
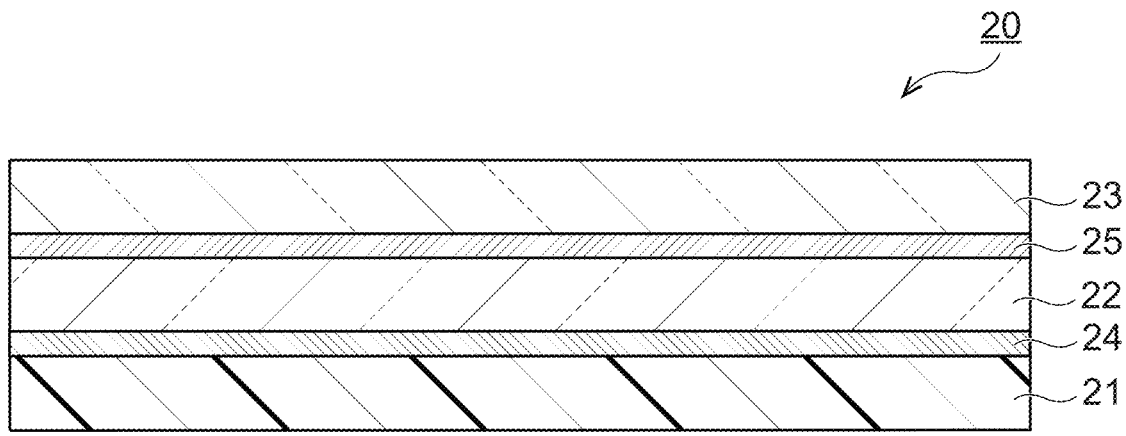
FIG. 2 is a schematic sectional view of a backside protective sheet for solar cell modules according to the first embodiment, illustrating the structure of the layers constituting the backside protective sheet.
Figure 3:
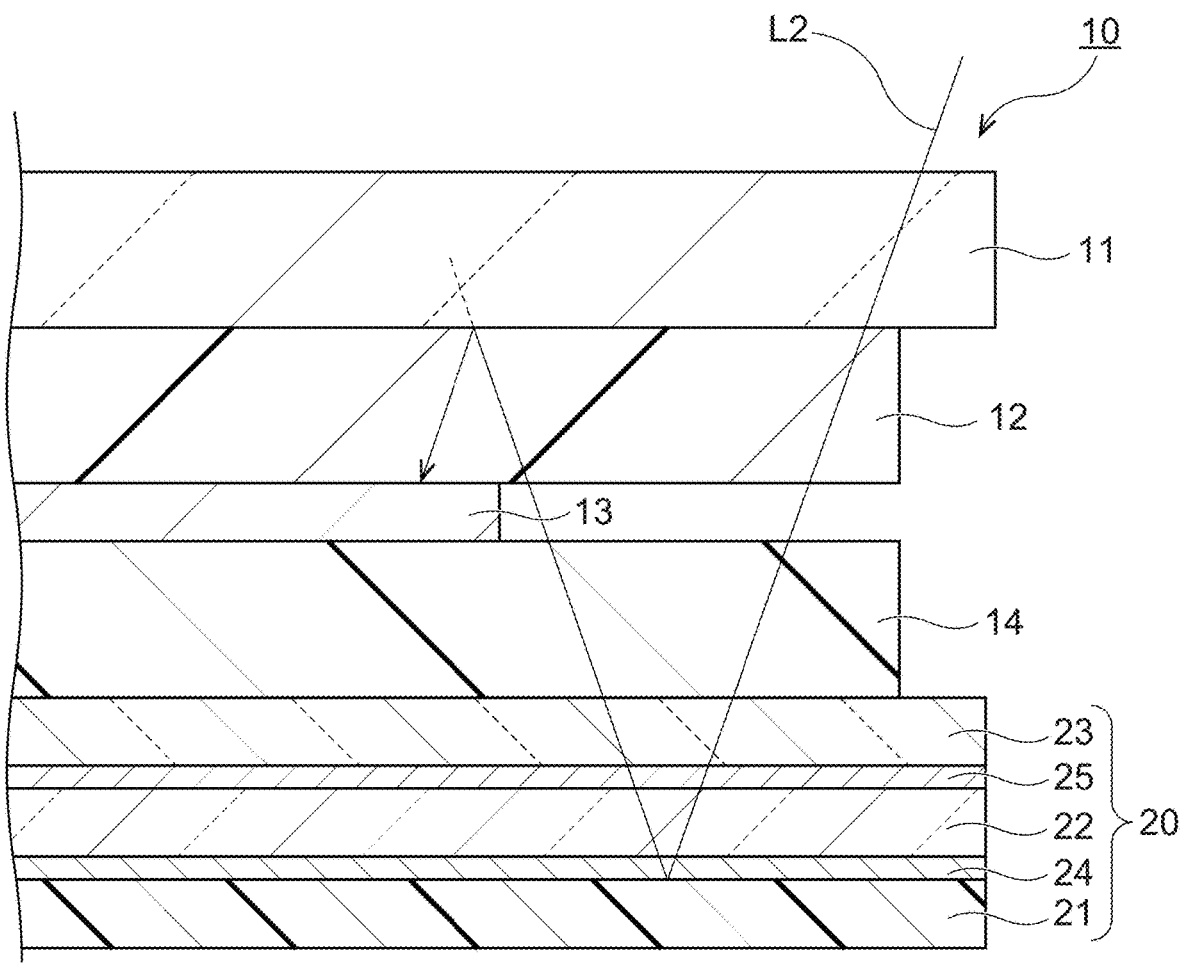
FIG. 3 is a schematic sectional view of the solar cell module according to the first embodiment.

The term "light-receiving surface-side" used herein refers to a side on which the surface of the solar cell module on which sunlight is incident is located, that is, specifically, the upper sides of FIGS. 1 to 3.

First Embodiment

Details of a backside protective sheet for solar cell modules (hereinafter, referred to simply as "backside protective sheet") according to a first embodiment are described below. Note that this embodiment is not limited by the following description.

First, a solar cell module that includes the backside protective sheet for solar cell modules according to this embodiment is described. FIG. 1 is a schematic sectional view of the solar cell module, illustrating an example of the structure of the layers constituting the solar cell module.

As illustrated in FIG. 1, a solar cell module 10 constituting a solar battery includes a transparent frontside substrate 11, a frontside encapsulant layer 12, a solar cell element 13, a backside encapsulant layer 14, and a backside protective sheet 20, which are stacked on top of one another in order closest to a light-receiving surface-side on which incident light L1 is incident. The solar cell module 10 may be prepared by subsequently stacking the transparent frontside substrate 11, the frontside encapsulant layer 12, the solar cell element 13, the backside encapsulant layer 14, and the backside protective sheet 20 on top of one another and integrating them into a single body by, for example, vacuum heat lamination process. In such a case, the laminating temperature is preferably 130° C. or more and 190° C. or less, the amount of time during which lamination is performed is preferably 5 minutes or more and 60 minutes or less and is particularly preferably 8 minutes or more and 40 minutes or less. In the above-described manner, the above layers are integrated into a single body, which is subjected to thermo-compression bonding to form a solar cell module 10. In this embodiment, the solar cell module 10 including the backside protective sheet 20 in the above-described manner is also provided.

[Overall Structure of Backside Protective Sheet for Solar Cell Modules]

The backside protective sheet 20 according to this embodiment is described below with reference to FIG. 2. The backside protective sheet 20 is included in the above-described solar cell module 10 and has a black appearance as a whole. Note that the term "black" used herein refers to not only achromatic black but also dark gray, chromatic black, and chromatic dark gray. Examples of the chromatic black and chromatic dark gray include reddish black and dark reddish gray, yellowish black and dark yellowish gray, greenish black and dark greenish gray, bluish black and dark bluish gray, and purplish black and dark purplish gray.

The backside protective sheet 20 includes a first layer 21 configured to reflect near-infrared light, a first black layer 24 arranged closer to the light-receiving surface-side than the first layer 21, and a second black layer 25 arranged closer to the light-receiving surface-side than the first black layer 24. A transparent second layer 22 configured to transmit near-infrared light is interposed between the first black layer 24 and the second black layer 25. A transparent third layer 23 configured to transmit near-infrared light is arranged closer to the light-receiving surface-side than the second black layer 25.

In the above case, the backside protective sheet 20 is constituted by five layers. Specifically, the first black layer 24 is disposed directly on the first layer 21, and the second layer 22 is disposed directly on the first black layer 24. Furthermore, the second black layer 25 is disposed directly on the second layer 22, and the third layer 23 is disposed directly on the second black layer 25. The first layer 21 is located on the outermost layer-side (the side opposite to the light-receiving surface-side) of the solar cell module 10, while the third layer 23 is located on the inner layer-side of the solar cell module 10, that is, the backside encapsulant layer 14-side (the light-receiving surface-side).

The layers constituting the backside protective sheet 20 are described below.

[First Layer]

The first layer 21 is, for example, a resin sheet containing a white pigment or a resin sheet including a coat layer (coating film or print film) containing a white pigment, the coat layer being disposed on the resin sheet. The first layer 21 may be a white resin layer configured to reflect near-infrared light. The first layer 21 may be a reflective layer configured to reflect near-infrared light that has passed through the second black layer 25, the second layer 22, and the first black layer 24. The first layer 21, which reflects near-infrared light, contributes to an increase in the power generation efficiency of the solar cell module 10. Note that the term "white" used herein refers to not only achromatic white but also light gray and chromatic light gray. Note that, hereinafter, a sheet-like member composed of a resin is referred to as "resin sheet". This term refers also to resin film.

The resin sheet constituting the first layer 21 may be preferably a resin sheet composed of a fluororesin, such as polytetrafluoroethylene (PTFE) or tetrafluoroethylene-ethylene copolymer (ETFE), a polyester resin, such as a poly(meth)acrylic resin or polyethylene terephthalate (PET), or the like. Alternatively, the resin sheet constituting the first layer 21 may be a resin sheet composed of a polyolefin resin or a resin sheet composed of polybutylene terephthalate (PBT), polyphenyl ether (PPE), polyethylene naphthalate (PEN), or the like. In this embodiment, since the first layer 21 is located on the outermost layer-side (the side opposite to the light-receiving surface-side) of the solar cell module 10, the first layer 21 is required to have high weather resistance, a high barrier property, and high hydrolysis resistance. From the above viewpoint, among the above resins, a polyester resin, such as PET, is preferably used.

The first layer 21 is capable of reflecting near-infrared light. Therefore, the first layer 21 is preferably a white resin layer containing white pigment particles having a size of 0.1 µm or more and 1.5 µm or less and is more preferably a white resin layer containing white pigment particles having a size of 0.1 µm or more and 0.6 µm or less. It is preferable that the proportion of white pigment particles having a size of 0.1 µm or more and 0.6 µm or less to all the white pigment particles included in the first layer 21 be 80% by mass or more. When the size and proportion of the above white pigment particles fall within the above ranges, the white resin layer is capable of reflecting near-infrared light with high efficiency and, consequently, the white pigment contributes to an increase in the power generation efficiency of the solar cell module. Note that the expression "reflect near-infrared light" used herein means that, for example, the average reflectance in the wavelength range of about 750 nm or more and about 1200 nm or less is 50% or more. The term "average reflectance" used herein refers to the value determined by extracting the above wavelength range from a reflectance spectrum (reflectance values at respective wavelengths) and taking the average thereof. For example, the average reflectance in the wavelength range of 750 nm or more and 1200 nm or less can be calculated as "(total sum of the reflectance values at respective wavelengths)/(1200–750)".

Typical examples of the white pigment particles having a size of 0.1 µm or more and 1.5 µm or less include titanium oxide particles. In this embodiment, it is preferable to use titanium oxide particles as white pigment particles. The titanium oxide particles may optionally be surface-treated. For example, in the case where titanium oxide is used, it can be produced by the following method.

To hydrous titanium oxide used as a raw material, a certain amount of aluminum compound which is 0.1% by mass or more and 0.5% by mass or less of the amount of titanium oxide in terms of aluminum oxide, a certain amount of potassium compound which is 0.1% by mass or more and 0.5% by mass or less of the amount of titanium oxide in terms of potassium carbonate, and a certain amount of zinc compound which is 0.2% by mass or more and 1.0% by mass or less of the amount of titanium oxide in terms of zinc oxide are added. The resulting mixture is dried and roasted to form titanium oxide.

Examples of the method for producing the first layer 21 include a method in which a coat layer containing a white pigment is formed on a resin sheet; and a method in which a white pigment is kneaded into a resin sheet. The above methods are not limited; the first layer 21 can be produced by any of the methods known in the related art.

In the case where a coat layer (coating film or print film) containing a white pigment is formed on a resin sheet, a paint or ink composition is prepared by adding a white pigment and, as needed, additives, such as a ultraviolet absorber and a crosslinking agent, to a common paint or ink vehicle, which serves as a principal component, and the paint or ink composition is applied or deposited onto the surface of a base film by a common coating or printing method or the like to form a coating or print film.

In the case where a white pigment is kneaded into a resin sheet, a resin composition is prepared by adding a white pigment and, as needed, additives to a resin constituting the resin sheet, which serves as a principal component, and the resin composition is formed into a film or sheet by a film forming method, such as an extrusion method or a T-die method. Hereby, a sheet including a white pigment kneaded therein can be produced.

The thickness of the first layer 21 is preferably, for example, 25 µm or more and 200 µm or less and is more preferably 40 µm or more and 150 µm or less. Limiting the thickness of the first layer 21 to 25 µm or more enables the first layer 21 to readily reflect near-infrared light and enhances the weather resistance, barrier property, and hydrolysis resistance of the first layer 21 to high levels. Limiting the thickness of the first layer 21 to 200 µm or less can suppress an increase in the production costs of the backside protective sheet 20.

[First Black Layer]

The first black layer 24 may be an adhesive layer that principally bonds the first layer 21 and the second layer 22 to each other and may be a black adhesive layer. In this embodiment, the first black layer 24 is formed as a result of a black adhesive being applied onto the upper surface (surface on the light-receiving surface-side) of the first layer 21 or the lower surface (surface on the side opposite to the light-receiving surface-side) of the second layer 22 and cured subsequent to the formation of the multilayer body.

The first black layer 24 is required to have sufficiently high adhesive property and sufficiently high bond durability. The first black layer 24 according to this embodiment may further have, in addition to the above properties, a black appearance, that is, a property of absorbing visible light and transmitting near-infrared light. The term "near-infrared light" used in this embodiment refers to electromagnetic waves having wavelengths of 750 nm or more and 2200 nm or less. Among these, wavelengths of 1000 nm or more and 1500 nm or less particularly accelerate the heat storage.

The black adhesive constituting the first black layer 24 is an adhesive that has a property of transmitting light beams having wavelengths of 750 nm or more and 1500 nm or less when cured. Note that the expression "transmit light beams having wavelengths of 750 nm or more and 1500 nm or less" means that the transmittance of light beams having wavelengths of 750 nm or more and 1500 nm or less through the first black layer 24 is 15% or more, is preferably 50% or more, and is further preferably 80% or more. The transmittance of visible light and ultraviolet light is not limited as long as the first black layer 24 appears black.

The black adhesive composition used for producing the first black layer 24 preferably includes an organic black pigment as a principal component. The composition may include a solvent as needed in consideration of coating properties and ease of handling. It is preferable to use a two-component adhesive including a main agent and a curing agent as a principal component of the black adhesive composition.

Examples of the main agent component include a urethane material. The urethane material may, but does not necessarily, include a carbonate. In the case where a urethane material including a carbonate is used, the main agent component is preferably a polyurethane/polycarbonate diol material including a mixture of a polyurethane diol with an aliphatic polycarbonate diol. Since the polyurethane diol and aliphatic polycarbonate diol constituting the main agent are both polyols including a hydroxyl group, they react with a curing agent including an isocyanate group to form an adhesive layer. In this embodiment, a mixture of a predetermined amount of a specific polyurethane diol with a predetermined amount of a specific aliphatic polycarbonate diol is used as a main agent in order to enhance the adhesive property and weather resistance of the adhesive layer.

The curing agent includes a polyisocyanate compound as a principal component. A polyisocyanate compound is a compound that includes two or more isocyanate groups per molecule and causes the crosslinking of the polyurethane diol compound as a result of the isocyanate groups reacting with the hydroxyl groups of the polyurethane diol compound used as a main agent. The polyisocyanate compound may be any polyisocyanate compound capable of causing the crosslinking of the polyurethane diol compound used as a main agent. Examples of such a polyisocyanate compound may include polyurethane diisocyanate, hexamethylene diisocyanate (hereinafter, abbreviated as "HDI"), and isocyanurate-modified isophorone diisocyanate (hereinafter, referred to as "nurate-modified IPDI"). Among the above polyisocyanate compounds, a mixture of HDI with nurate-modified IPDI is preferable in order to enhance reactivity with hydroxyl groups.

The coloring material used for coloring the first black layer 24 in black may be an organic black pigment. Specific examples of the organic black pigment include an oxazine pigment, a pyrrole pigment, a quinacridone pigment, an azo pigment, a perylene pigment, a dioxane pigment, an isoindolinone pigment, an indanthrene pigment, a quinophthalone pigment, a perinone pigment, and a phthalocyanine pigment.

In particular, in the case where two black layers (the first black layer 24 and the second black layer 25) are used as in this embodiment, it is preferable to use a perylene black pigment as a coloring material, because a perylene black pigment enables a suitable degree of blackness to be readily achieved. Examples of the perylene black pigment may include Lumogen Black K0087 (produced by BASF). The use of the perylene black pigment can reduce the degree of color unevenness (the phenomenon in which the density of black becomes nonuniform in the surface) that occurs in the backside protective sheet 20 to an unnoticeable level as a whole, even in the case where the contents of the black pigment in the first black layer 24 and the second black layer 25 are reduced. Furthermore, even in the case where the contents of the black pigment in the first black layer 24 and the second black layer 25 are reduced, the spectral transmittance of the visible light range through the backside protective sheet 20 can be reduced as a whole and, consequently, the degree of blackness of the backside protective sheet 20 can be increased as a whole.

The contents of the black pigment in the first black layer 24 and the second black layer 25 are each preferably 5% by mass or more and less than 10% by mass and are each further preferably 7% by mass or more and 9% by mass or less. Limiting the contents of the black pigment in the first black layer 24 and the second black layer 25 to be each 5% by mass or more can reduce the degree of color unevenness that occurs in the backside protective sheet 20 to an unnoticeable level as a whole and enables a certain degree of blackness of the backside protective sheet 20 to be achieved as a whole. Limiting the contents of the black pigment in the first black layer 24 and the second black layer 25 to be each less than 10% by mass, that is, limiting the contents of the black pigment to low levels, suppresses reductions in the adhesive strengths of the first black layer 24 and the second black layer 25 and consequently can increase the long-term reliability of the backside protective sheet 20. As a comparative example, in the case where the backside protective sheet includes only one black layer, it is considered that the content of the color pigment needs to be 20% by mass or more in order to achieve the same degree of blackness as that of the backside protective sheet 20 according to this embodiment. In such a case, the adhesive strength of the black layer may be reduced while the backside protective sheet is used over a prolonged period of time.

The above black adhesive composition preferably includes a solvent component in order to achieve suitable coating properties and ease of handling. Examples of the solvent component may include, but are not limited to, carboxylic acid esters, such as ethyl acetate, methyl acetate, and methyl propionate. As described above, the principal component of the above adhesive is a two-component adhesive including a main agent and a curing agent. The solvent component included in the main agent and the solvent component included in the curing agent are each independently selected and may be the same as or different from each other.

The above-described black adhesive composition is applied to or deposited on the first layer 21 and/or the second layer 22 and then cured by drying to form a first black layer 24. Examples of the application method include a coating method, such as roll coating, gravure roll coating, or kiss coating, and a printing method. The amount of the black adhesive composition applied is preferably 3 g/m² or more and 7 g/m² or less. The thickness of the first black layer 24 is preferably 2.0 µm or more and 10 µm or less and is further preferably 3.0 µm or more and 6.0 µm or less. Limiting the thickness of the first black layer 24 to 2.0 µm or more enables the adhesive strength between the first layer 21 and the second layer 22 to be maintained. Limiting the thickness of the first black layer 24 to 10 µm or less enables the first black layer 24 to transmit near-infrared light with efficiency.

[Second Layer]

The second layer 22 is interposed between the first black layer 24 and the second black layer 25. The second layer 22 increases the strength of the backside protective sheet 20 and enables both the first black layer 24 and the second black layer 25 to be visually recognized from the light-receiving surface-side. Therefore, the second layer 22 may be a transparent intermediate layer configured to transmit near-infrared light and visible light. The second layer 22 may be transparent or semitransparent. From the above viewpoints, the second layer 22 is preferably composed of a polyolefin resin, such as a polyethylene resin or a polypropylene resin, or a polyethylene terephthalate (PET) resin. Among the above resins, PET may be particularly preferably used because it has particularly high transparency and is excellent in terms of graphical design function. Note that the expression "transmit near-infrared light" means that the transmittance of all the light beams having wavelengths of 750 nm or more and 1500 nm or less through the second layer 22 is 80% or more, and the expression "transmit visible light" means that the transmittance of all the light beams having wavelengths of 380 nm or more and 750 nm or less through the second layer 22 is 80% or more.

The haze value of the second layer 22 is preferably 4% or more and 10% or less. Limiting the haze value of the second layer 22 to fall within the above range enables the second layer 22 to have an adequate turbidity and consequently makes it possible to reduce the contents of the black pigment in the first black layer 24 and the second black layer 25. Furthermore, even in the case where the contents of the black pigment are reduced as described above, the degree of color unevenness that occurs in the backside protective sheet 20 can be reduced to an unnoticeable level as a whole. The above haze value can be measured with Haze Meter (produced by Murakami Color Research Laboratory Co., Ltd., Product number: HM-150) by a method conforming to JIS K7136.

[Second Black Layer]

The second black layer 25 may be an adhesive layer that principally bonds the second layer 22 and the third layer 23 to each other and may be a black adhesive layer. In this embodiment, the second black layer 25 is formed as a result of a black adhesive being applied onto the upper surface (surface on the light-receiving surface-side) of the second layer 22 or the lower surface (surface on the side opposite to the light-receiving surface-side) of the third layer 23 and cured subsequent to the formation of the multilayer body.

The second black layer 25 is required to have sufficiently high adhesive property and sufficiently high bond durability. The second black layer 25 according to this embodiment may further have, in addition to the above properties, a black appearance, that is, a property of absorbing visible light and transmitting near-infrared light.

Examples of the materials constituting the second black layer 25 may be the same as the above-described examples of the materials constituting the first black layer 24. In such a case, the materials constituting the second black layer 25 may be the same as or different from those constituting the first black layer 24.

In particular, in the case where two black layers (the first black layer 24 and the second black layer 25) are used as in this embodiment, the use of a perylene black pigment as a coloring material can reduce the degree of color unevenness that occurs in each of the first black layer 24 and the second black layer 25 to an unnoticeable level. Furthermore, the spectral transmittance of the visible light range through the first black layer 24 and the second black layer 25 can be reduced as a whole and, consequently, the degree of blackness of the first black layer 24 and the second black layer 25 can be increased as a whole. The content of the black pigment in the second black layer 25 is preferably 5% by mass or more and less than 10% by mass and is further preferably 7% by mass or more and 9% by mass or less.

A second black layer 25 can be formed by applying or depositing the above-described black adhesive composition onto the second layer 22 and/or the third layer 23 and then performing curing by drying. The method used for the application of the black adhesive composition may be the same as in the formation of the first black layer 24. The amount of the black adhesive composition applied is preferably 3 g/m$^2$ or more and 7 g/m$^2$ or less. The thickness of the second black layer 25 is preferably 2.0 µm or more and 10 µm or less and is further preferably 3.0 µm or more and 6.0 µm or less. The thickness of the second black layer 25 may be the same as or different from that of the first black layer 24.

In this embodiment, the first black layer 24 and the second black layer 25 are thin layers each having a thickness of 2.0 µm or more and 10 µm or less as described above. Therefore, in the case where the first black layer 24 and the second black layer 25 include a black pigment, it is difficult to uniformly disperse the black pigment particles included in each layer all over the layer and, consequently, color unevenness is likely to occur. In this embodiment, the use of two black layers (the first black layer 24 and the second black layer 25) described above reduces the degree of the color unevenness and enables a high density of black with an increased degree of blackness to be achieved as a whole.

[Third Layer]

The third layer 23 may increase the adhesive property between the backside encapsulant layer 14, which is composed of an ethylene-vinyl acetate alcohol copolymer resin (EVA resin) or a polyolefin, such as a polyethylene, and the backside protective sheet 20. The third layer 23 may be a transparent adhesion layer. The third layer 23 is configured to transmit the near-infrared light reflected on the first layer 21 and may be a transparent or semitransparent layer configured to transmit visible light, in response to requests for graphical design function. From the above viewpoints, the third layer 23 is preferably composed of a polyolefin resin, such as a polyethylene resin (e.g., low-density polyethylene (LDPE), medium-density polyethylene (MDPE), high-density polyethylene (HDPE), or straight-chain (linear) low-density polyethylene (LLDPE)) or a polypropylene resin, polyethylene terephthalate (PET), or the like. Among the above resins, low-density polyethylene (LDPE) may be particularly preferably used. Note that the expression "transmit near-infrared light" means that the transmittance of all the light beams having wavelengths of 750 nm or more and 1500 nm or less through the third layer 23 is 80% or more, and the expression "transmit visible light" means that the transmittance of all the light beams having wavelengths of 380 nm or more and 750 nm or less through the third layer 23 is 80% or more. The thickness of the third layer 23 is preferably, for example, 30 µm or more and 120 µm or less and is more preferably 40 µm or more and 80 µm or less.

[Method for Producing Backside Protective Sheet for Solar Cell Modules]

The backside protective sheet 20 can be produced by interposing the first black layer 24 between the first layer 21 and the second layer 22 and the second black layer 25 between the second layer 22 and the third layer 23 and subsequently subjecting the above layers to a dry lamination process.

[Action of Embodiment]

The action of this embodiment having the above-described structure is described below.

As illustrated in FIG. 1, incident light L1 is incident onto the light-receiving surface of the solar cell module 10 according to the embodiment. Part of the incident light L1 subsequently passes through the transparent frontside substrate 11 and the frontside encapsulant layer 12 and then reaches the solar cell element 13. Consequently, the solar cell element 13 generates electric power.

On the other hand, another part of the incident light L1 does not reach the solar cell element 13 in a direct manner. Specifically, as illustrated in FIG. 3, part of the sunlight (incident light L2) which has not been absorbed by the solar cell element 13 is incident onto the third layer 23-side surface of the backside protective sheet 20. Most of the near-infrared light included in the incident light L2 passes through the third layer 23, the second black layer 25, the second layer 22, and the first black layer 24 without being absorbed by these layers and reaches the first layer 21. Since the first layer 21 is provided to reflect near-infrared light, most of the near-infrared light that has reached the first layer 21 is reflected on the first layer 21 to return to the first black layer 24, the second layer 22, the second black layer 25, and the third layer 23. The reflected near-infrared light passes through the first black layer 24, the second layer 22, the second black layer 25, and the third layer 23, is subsequently further reflected, and is then absorbed by the solar cell element 13. Since the first black layer 24, the second layer 22, the second black layer 25, and the third layer 23 do not absorb near-infrared light, an increase in the temperature of the solar cell module 10 which may be caused as a result of the absorption of near-infrared light by the first black layer 24, the second layer 22, the second black layer 25, and the third layer 23 can be suppressed. This suppresses a reduction in power generation efficiency which may be caused when the temperature of the solar cell module 10 is increased. Furthermore, the use of the backside protective sheet 20 markedly increases the amount of near-infrared light absorbed by the solar cell element 13. This can increase the power generation efficiency of the solar cell module 10.

Since most of the encapsulants commonly used for producing the solar cell module 10 are transparent or semi-transparent, when the solar cell module 10 is viewed from the transparent frontside substrate 11-side, the color of the first black layer 24 and the second black layer 25 can be seen through the third layer 23 and the second layer 22 at the positions of gaps in which the solar cell element 13 is not disposed. In this case, black color of the first black layer 24 and the second black layer 25 can be seen overlapping each other. This makes it possible to, even in the case where color unevenness occurs in each of the first black layer 24 and the second black layer 25, counteract the color unevenness phenomena, compared with the case where only one black layer is used alone. Consequently, the degree of color unevenness of the backside protective sheet 20 can be reduced to an unnoticeable level as a whole.

In many cases, the surface of the solar cell element 13 is black. In particular, most of the thin-film solar cell elements, which have been in increasing demand in recent years, have a black surface. Since the first black layer 24 and the second black layer 25 included in the backside protective sheet 20 according to this embodiment are black, most of the solar cell modules 10 and, in particular, thin-film solar cell modules 10 including thin-film solar cell elements are allowed to have a black appearance as a whole with no color unevenness, which is preferable in terms of graphical design function.

There has been devised a backside protective sheet for solar cell modules which includes a black resin layer including an organic pigment, such as an oxazine pigment, which is capable of transmitting infrared light, a white resin layer capable of reflecting infrared light, a backside protective layer having weather resistance, and the like in order to reduce the generation of heat in the black backside protective sheet and increase the power generation efficiency by allowing the reflected light to be incident on the solar cell element, the backside protective sheet being produced by bonding the above layers to one another with an adhesive or the like (Japanese Unexamined Patent Application Publication No. 2012-216689).

As described above, it is common to prepare a black backside protective sheet by mixing a black pigment with a resin. However, in particular, in the case where the layer including a black pigment is a thin-film layer having a small thickness, color unevenness is likely to occur. Moreover, it is difficult to achieve a sufficiently high density of black unless the content of the black pigment in the thin-film layer is increased.

In this respect, according to this embodiment, it is possible to provide the backside protective sheet 20 for solar cell modules and the solar cell module 10 that reduce the occurrence of the color unevenness and appear black at a sufficiently high density.

As described above, according to this embodiment, the backside protective sheet 20 includes two black layers, that is, the first black layer 24 and the second black layer 25. This makes it possible to reduce the degree of color unevenness that occurs in the backside protective sheet 20 as a whole by superimposing the two layers, that is, the first black layer 24 and the second black layer 25, on each other even in the case where color unevenness occurs in each of the first black layer 24 and the second black layer 25 and provide the black backside protective sheet 20 suitable in terms of graphical design function. In particular, even in the case where the thicknesses of the first black layer 24 and the second black layer 25 are reduced to, for example, about 10 µm or less and color unevenness is likely to occur in each of the first black layer 24 and the second black layer 25, the degree of color unevenness that occurs in the backside protective sheet 20 can be reduced as a whole. Moreover, the contents of the black pigment in the first black layer 24 and the second black layer 25 can be reduced to low levels. Even in the case where the contents of the black pigment in the first black layer 24 and the second black layer 25 are reduced as described above, the backside protective sheet 20 can achieve a sufficiently high intensity of black as a whole.

According to this embodiment, the second layer 22 configured to transmit near-infrared light and visible light is interposed between the first black layer 24 and the second black layer 25. This enables the first black layer 24 and the second black layer 25 to be visually recognized from the outside through the second layer 22 and allows the backside protective sheet 20 to have a black appearance having a sufficient density with reduced color unevenness.

According to this embodiment, the third layer 23 configured to transmit near-infrared light and visible light is arranged close to the light-receiving surface-side than the second black layer 25. This enables the first black layer 24 and the second black layer 25 to be visually recognized from the outside through the third layer 23. Consequently, the backside protective sheet 20 may have a black appearance having a sufficient density with reduced color unevenness.

According to this embodiment, the first black layer 24 and the second black layer 25 are black adhesive layers. This enables the first layer 21, the second layer 22, and the third layer 23 to be bonded to one another with the first black layer 24 and the second black layer 25. According to this embodiment, two black layers (the first black layer 24 and the second black layer 25) are used. This can reduce the degree of color unevenness that occurs in the backside protective sheet 20 as a whole, even in the case where the black layers are adhesive layers having small thicknesses. Moreover, the contents of the black pigment in the first black layer 24 and the second black layer 25, which are adhesive layers having small thicknesses, can be reduced.

According to this embodiment, the first black layer 24 and the second black layer 25 each include a perylene black pigment. This can reduce the degree of color unevenness in the backside protective sheet 20 to an unnoticeable level as a whole, even in the case where the contents of the black pigment in the first black layer 24 and the second black layer 25 are reduced. Furthermore, even in the case where the contents of the black pigment in the first black layer 24 and the second black layer 25 are reduced, the spectral transmittance of the visible light region through the backside protective sheet 20 can be reduced as a whole and, consequently, the degree of blackness of the backside protective sheet 20 can be increased as a whole.

According to this embodiment, the contents of the black pigment in the first black layer 24 and the second black layer 25 are each 5% by mass or more and less than 10% by mass. This reduces the degree of color unevenness that occurs in the backside protective sheet 20 to an unnoticeable level as a whole and enables a certain degree of blackness of the backside protective sheet 20 to be achieved as a whole. In addition, reductions in the adhesive strengths of the first black layer 24 and the second black layer 25 can be suppressed and, consequently, the long-term reliability of the backside protective sheet 20 can be increased. As described above, in this embodiment, since two black layers (the first black layer 24 and the second black layer 25) are used, the concentrations of the black pigment in the two black layers can be reduced.

According to this embodiment, the haze value of the second layer 22 is 4% or more and 10% or less. This can reduce the degree of color unevenness that occurs in the backside protective sheet 20 to an unnoticeable level as a whole, even in the case where the contents of the black pigment in the first black layer 24 and the second black layer 25 are reduced.

[Modification Example of Backside Protective Sheet for Solar Cell Modules]

Although the above embodiment is described taking, as an example, the case where the second layer 22 (transparent intermediate layer) is interposed between the first black layer 24 and the second black layer 25, the above embodiment is not limited to this. For example, the second black layer 25 may be disposed directly on the first black layer 24 without forming the second layer 22. Alternatively, another intermediate layer may be interposed between the first black layer 24 and the second black layer 25 in addition to the second layer 22. In such a case, the other intermediate layer is preferably configured to transmit near-infrared light and visible light.

Although the above embodiment is described taking, as an example, the case where the backside protective sheet 20 includes two black layers (the first black layer 24 and the second black layer 25), the above embodiment is not limited to this. For example, one or more additional black layers may be (i) arranged closer to the light-receiving surface-side than the first black layer 24, (ii) interposed between the first black layer 24 and the second black layer 25, and/or (ii) arranged closer to the side opposite to the light-receiving surface-side than the second black layer 25. The additional black layers are preferably capable of absorbing visible light and transmitting near-infrared light.

Although the above embodiment is described taking, as an example, the case where the third layer 23 (transparent adhesion layer) is arranged closer to the light-receiving surface-side than the second black layer 25, the above embodiment is not limited to this. For example, the third layer 23 may be omitted, and the second layer 22 and the backside encapsulant layer 14 may be bonded to each other with the second black layer 25.

Although the above embodiment is described taking, as an example, the case where the first black layer 24 and the second black layer 25 are black adhesive layers, the above embodiment is not limited to this. At least one of the first black layer 24 and the second black layer 25 may be a black non-adhesive layer that is not an adhesive layer. In such a case, at least one of the first black layer 24 and the second black layer 25 may be, for example, a black resin layer prepared by adding a black pigment to a film composed of a polyolefin resin, such as a polyethylene resin or a polypropylene resin, a polyethylene terephthalate (PET) resin, or the like. Although the above embodiment is described taking, as an example, the case where the first black layer 24 and the second black layer 25 include a black pigment, the above embodiment is not limited to this. Black or any color other than black may be produced by using one or more types of pigments other than a black pigment.

Although the above embodiment is described taking, as an example, the case where black layers (the first black layer 24 and the second black layer 25) are used, the above embodiment is not limited to this. A colored layer may be used instead of a black layer. The colored layer may be an adhesive layer that has been colored (colored adhesive layer). The color of the colored layer is not limited to black and may be, for example, a dark color close to black. Examples of the dark color close to black include bluish purple, purplish red, and gray. The color of the colored layer is not limited to dark colors; the colored layer may be colored in a desired color in order to impart graphical design function to the backside protective sheet 20.

EXAMPLES

Specific examples of the above embodiment are described below.

(Preparation of Backside Protective Sheet)

Backside protective sheets of Examples 1 to 3 and Comparative examples 1 and 2 were prepared in the following manner.

Example 1

A backside protective sheet having the structure illustrated in FIG. 2 was prepared. First, second, and third layers were prepared first. The first layer was a hydrolysis-resistant white PET film having a thickness of 50 μm, which included titanium oxide. The second layer was a transparent PET film having a thickness of 125 μm and a haze value of 6%. The third layer was a transparent LDPE film having a thickness of 60 μm. Subsequently, a first black layer was interposed between the first and second layers and a second black layer was interposed between the second and third layers. The above layers were subjected to a dry lamination process to form a backside protective sheet. The first and second black layers were composed of a mixture of a urethane resin serving as a principal component with a perylene black pigment. The contents of the perylene black pigment in the black layers were each 7% by mass. The thicknesses of the first and second black layers were each 4.5 μm.

Example 2

A backside protective sheet of Example 2 was prepared as in Example 1, except that the black pigments included in the first and second black layers were changed to phthalocyanine and benzimidazolourethane, respectively, and the contents of the black pigments in the black layers were each changed to 9% by mass.

Example 3

A backside protective sheet of Example 3 was prepared as in Example 1, except that the second layer was changed to a transparent PET film having a haze value of 12%.

Comparative Example 1

A backside protective sheet of Comparative example 1 was prepared as in Example 1, except that the first black layer was replaced with a transparent adhesive layer and the content of the black pigment in the second black layer was changed to 18% by mass. The transparent adhesive layer included polycarbonate polyurethane as a principal component.

Comparative Example 2

A backside protective sheet of Comparative example 2 was prepared as in Example 1, except that the first black layer was replaced with a transparent adhesive layer and the content of the black pigment in the second black layer was changed to 25% by mass. The transparent adhesive layer included polycarbonate polyurethane as a principal component.

The color unevenness, degree of blackness, and adhesive strength of each of the backside protective sheets prepared in Examples 1 to 3 and Comparative examples 1 and 2 were measured.

In the measurement of color unevenness, the a* and b* values of the surface of the backside protective sheet in the CIE color coordinates with standard illuminant D65 were measured in accordance with JIS Z 8722 using "CM-2500C (produced by Konica Minolta, Inc.)". The average a* and b* values were calculated in each of the 100 measurement points determined by diving a 1-meter square backside protective sheet into 10-centimeters square zones. An evaluation of "○ (good)" was given when all of the a* values were within ±0.5 and all of the b* values were within ±0.5, and an evaluation of "x (poor)" was given otherwise.

In the measurement of the degree of blackness, relative reflectance was measured using a spectrophotometer (e.g., UV2450 produced by Shimadzu Corporation) equipped with an integrating sphere attachment (e.g., ISR2200 produced by Shimadzu Corporation), with the reflectance of a standard plate, which is composed of barium sulfate, being 100%. An evaluation of "● (excellent)" was given when the average reflectance in the range of 350 to 700 nm was 7% or less, an evaluation of "○ (good)" was given when the above average reflectance was 10% or less, and an evaluation of "x (poor)" was given when the above average reflectance was more than 10%.

Adhesive strength was measured at 180° and 300 mm/min in accordance with a method confirming to ISO8510-2. An evaluation of "○ (good)" was given when the adhesive strength was 3 N/10 mm or more, and an evaluation of "x (poor)" was given when the adhesive strength was less than 3 N/10 mm.

Table 1 lists the evaluation results.

TABLE 1

| | Black layer | Type of black pigment | Content of pigment in first black layer | Content of pigment in second black layer | Haze value of second layer | Color unevenness | Degree of blackness | Adhesive strength |
|---|---|---|---|---|---|---|---|---|
| Example 1 | Two layers | Perylene | 7 wt % | 7 wt % | 6% | ○ | ◎ | ○ |
| Example 2 | Two layers | phthalocyanine, benzimidazolourethane | 9 wt % | 9 wt % | 6% | ○ | ◎ | ○ |
| Example 3 | Two layers | Perylene | 7 wt % | 7 wt % | 12% | ○ | ○ | ○ |
| Comparative example 1 | One layer | Perylene | | 18 wt % | | x | x | ○ |
| Comparative example 2 | One layer | Perylene | | 25 wt % | | ○ | ◎ | x |

As described in Table 1, in the case where the backside protective sheets prepared in Examples 1 to 3 were used, excellent results were confirmed in terms of both color unevenness and degree of blackness, compared with the case where the backside protective sheet prepared in Comparative example 1 was used. The backside protective sheet prepared in Comparative example 2 was evaluated as "Good" in term of color unevenness and degree of blackness, but had a lower adhesive strength than the backside protective sheets prepared in Examples 1 to 3, because the content of the pigment in the second black layer was high (25% by mass). Furthermore, the total content of black pigment in the backside protective sheet prepared in Comparative example 2 which was necessary for achieving a certain degree of color unevenness was higher than, for example, the total content of black pigment in the backside protective sheet prepared in Example 1 which was necessary for achieving the certain degree of color unevenness.

Second Embodiment

A second embodiment is described below with reference to FIGS. 4 to 8 below. FIGS. 4 to 8 are diagrams illustrating the second embodiment. In FIGS. 4 to 8, the same members as in the first embodiment illustrated in FIGS. 1 to 3 are each denoted by the same reference numeral, and the detailed description thereof is omitted. Hereinafter, differences from the first embodiment are primarily described.

[Overall Structure of Backside Protective Sheet for Solar Cell Modules]

Figure 4:
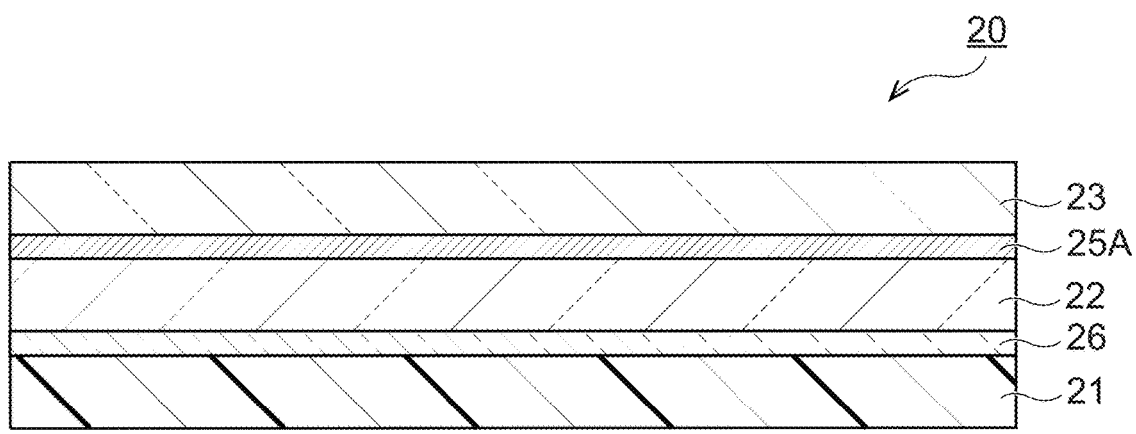
FIG. 4 is a schematic sectional view of a backside protective sheet for solar cell modules according to a second embodiment, illustrating the structure of the layers constituting the backside protective sheet.
Figure 5:
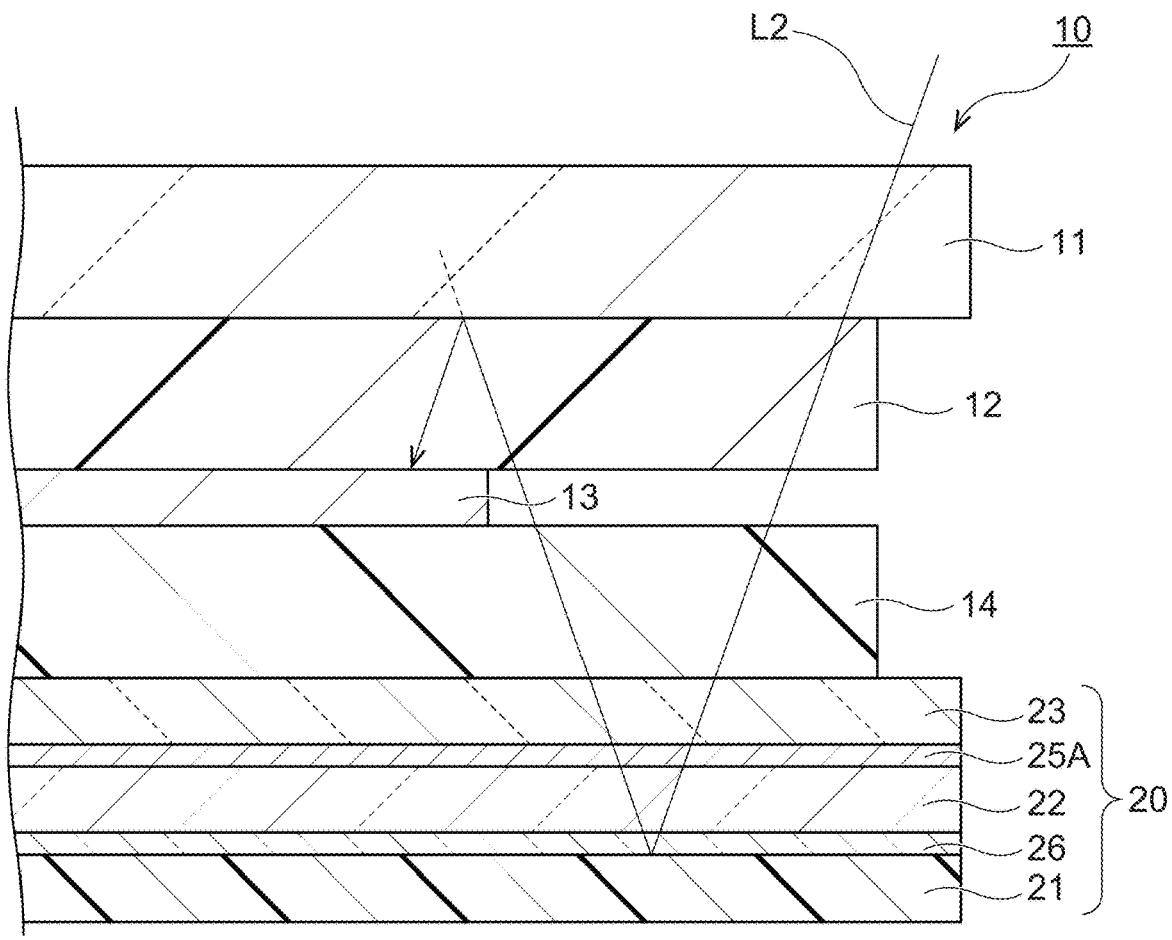
FIG. 5 is a schematic sectional view of a solar cell module according to the second embodiment.
Figure 6:
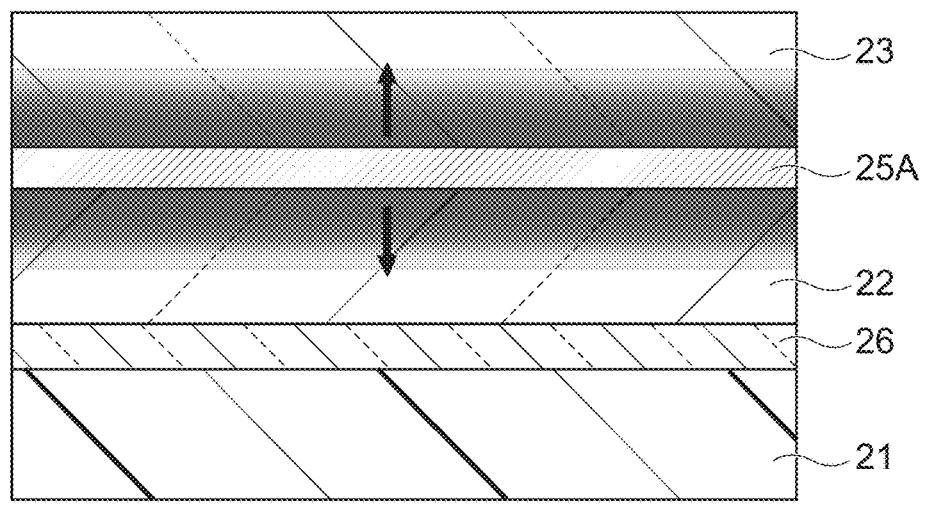
FIG. 6 is a schematic sectional view of a backside protective sheet for solar cell modules, illustrating the state in which migration has occurred in the backside protective sheet.

A backside protective sheet 20 according to this embodiment is described with reference to FIG. 4. As illustrated in FIG. 4, the backside protective sheet 20 according to this embodiment includes a first layer 21 configured to reflect near-infrared light, a transparent second layer 22 arranged closer to the light-receiving surface-side than the first layer 21, the second layer 22 being configured to transmit near-infrared light and visible light, and a transparent third layer 23 arranged closer to the light-receiving surface-side than the second layer 22, the third layer 23 being configured to transmit near-infrared light and visible light. Furthermore, a transparent fourth layer 26 configured to transmit near-infrared light and visible light is interposed between the first layer 21 and the second layer 22, and a black layer 25A is interposed between the second layer 22 and the third layer 23.

In the above case, the backside protective sheet 20 is constituted by five layers. Specifically, the fourth layer 26 is disposed directly on the first layer 21, and the second layer 22 is disposed directly on the fourth layer 26. Furthermore, the black layer 25A is disposed directly on the second layer 22, and the third layer 23 is disposed directly on the black layer 25A. The first layer 21 is located on the outermost layer-side (the side opposite to the light-receiving surface-side) of the solar cell module 10, while the third layer 23 is located on the inner layer-side of the solar cell module 10, that is, the backside encapsulant layer 14-side (the light-receiving surface-side).

The layers constituting the backside protective sheet 20 are described below.

[First Layer]

The first layer 21 is, for example, a resin sheet containing a white pigment or a resin sheet including a coat layer (coating film or print film) containing a white pigment, the coat layer being disposed on the resin sheet. The first layer 21 may be a white resin layer configured to reflect near-infrared light. The first layer 21 may be a reflective layer configured to reflect near-infrared light that has passed through the black layer 25A, the second layer 22, and the fourth layer 26. The structure of the first layer 21 may be substantially the same as in the first embodiment described above.

[Fourth Layer]

The fourth layer 26 may be an adhesive layer that principally bonds the first layer 21 and the second layer 22 to each other and may be a transparent adhesive layer. In this embodiment, the fourth layer 26 is formed as a result of a transparent adhesive being applied onto the upper surface (surface on the light-receiving surface-side) of the first layer 21 or the lower surface (surface on the side opposite to the light-receiving surface-side) of the second layer 22 and cured subsequent to the formation of the multilayer body.

The fourth layer 26 is required to have sufficiently high adhesive property and sufficiently high bond durability. The fourth layer 26 according to this embodiment may further have, in addition to the above properties, a transparent appearance, that is, a property of transmitting visible light and near-infrared light. The term "near-infrared light" used in this embodiment refers to electromagnetic waves having wavelengths of 750 nm or more and 2200 nm or less. Among these, wavelengths of 1000 nm or more and 1500 nm or less particularly accelerate the heat storage. Note that the expression "transmit near-infrared light" means that the transmittance of all the light beams having wavelengths of 750 nm or more and 1500 nm or less through the fourth layer 26 is 80% or more, and the expression "transmit visible light" means that the transmittance of all the light beams having wavelengths of 380 nm or more and 750 nm or less through the fourth layer 26 is 80% or more.

It is preferable to use a two-component adhesive including a main agent and a curing agent as a principal component of the transparent adhesive composition used for forming the fourth layer 26. The main agent component and the curing agent may be the same as those included in the first black layer 24 according to the first embodiment described above.

The above transparent adhesive composition preferably includes a solvent component in order to achieve suitable coating properties and ease of handling. The solvent component may be the same as that included in the first black layer 24 according to the first embodiment described above.

The above-described transparent adhesive composition is applied to or deposited on the first layer 21 and/or the second layer 22 and then cured by drying to form a fourth layer 26. Examples of the application method include a coating method, such as roll coating, gravure roll coating, or kiss coating, and a printing method. The amount of the transparent adhesive composition applied is preferably 3 g/m$^2$ or more and 7 g/m$^2$ or less. The thickness of the fourth layer 26 is preferably 2.0 μm or more and 10 μm or less and is further preferably 3.0 μm or more and 6.0 μm or less. Limiting the thickness of the fourth layer 26 to 2.0 μm or more enables the adhesive strength between the first layer 21 and the second layer 22 to be maintained. Limiting the thickness of the fourth layer 26 to 10 μm or less enables the fourth layer 26 to transmit near-infrared light with efficiency.

[Second Layer]

The second layer 22 is interposed between the fourth layer 26 and the black layer 25A. The second layer 22 increases the strength of the backside protective sheet 20 and reduces the negative impacts of the migration of the black pigment from the black layer 25A, which is described below. The second layer 22 may be a transparent intermediate layer configured to transmit near-infrared light and visible light.

The thickness of the second layer 22 is preferably, for example, 30 μm or more and 200 μm or less and is more preferably 100 μm or more and 150 μm or less. Limiting the thickness of the second layer 22 to 30 μm or more can suppress the black pigment included in the black layer 25A from migrating toward the first layer 21 by migration. Limiting the thickness of the second layer 22 to 200 μm or less enables the second layer 22 to transmit near-infrared light with efficiency. The structure of the second layer 22 may be substantially the same as in the first embodiment described above, except the above.

[Black Layer]

The black layer 25A may be an adhesive layer that principally bonds the second layer 22 and the third layer 23 to each other and may be a black adhesive layer. In this embodiment, the black layer 25A is formed as a result of a black adhesive being applied onto the upper surface (surface on the light-receiving surface-side) of the second layer 22 or the lower surface (surface on the side opposite to the light-receiving surface-side) of the third layer 23 and cured subsequent to the formation of the multilayer body.

The black layer 25A is required to have sufficiently high adhesive property and sufficiently high bond durability. The black layer 25A according to this embodiment may further have, in addition to the above properties, a black appearance, that is, a property of absorbing visible light and transmitting near-infrared light.

The black adhesive constituting the black layer 25A is an adhesive that has a property of transmitting light beams having wavelengths of 750 nm or more and 1500 nm or less when cured. Note that the expression "transmit light beams having wavelengths of 750 nm or more and 1500 nm or less" means that the transmittance of light beams having wavelengths of 750 nm or more and 1500 nm or less through the black layer 25A is 15% or more, is preferably 50% or more, and is further preferably 80% or more. The transmittance of visible light and ultraviolet light is not limited as long as the black layer 25A appears black.

The black adhesive composition used for producing the black layer 25A preferably includes an organic black pigment as a principal component. The composition may include a solvent as needed in consideration of coating properties and ease of handling. It is preferable to use a two-component adhesive including a main agent and a curing agent as a principal component of the black adhesive composition.

The main agent component and curing agent included in the black adhesive composition may be the same as those included in the transparent adhesive composition used for forming the fourth layer 26 described above.

A perylene black pigment is used as a coloring material for coloring the black layer 25A in black, because a perylene black pigment makes it easy to achieve a suitable degree of blackness. Examples of the perylene black pigment may include Lumogen Black K0087 (produced by BASF). The use of the perylene black pigment may reduce the degree of color unevenness (the phenomenon in which the density of black becomes nonuniform in the surface) that occurs in the backside protective sheet 20 to an unnoticeable level as a whole, even in the case where the content of the black pigment in the black layer 25A is reduced. Furthermore, even in the case where the content of the black pigment in the black layer 25A is reduced, the spectral transmittance of the visible light range through the backside protective sheet 20 can be reduced as a whole and, consequently, the degree of blackness of the backside protective sheet 20 can be increased as a whole.

The content of the black pigment in the black layer 25A is preferably 5% by mass or more and less than 30% by mass and is further preferably 10% by mass or more and 25% by mass or less. Limiting the content of the black pigment in the black layer 25A to 5% by mass or more can reduce the degree of color unevenness that occurs in the backside protective sheet 20 to an unnoticeable level as a whole and enables a certain degree of blackness of the backside protective sheet 20 to be achieved as a whole. Limiting the content of the black pigment in the black layer 25A to less than 30% by mass suppresses a reduction in the adhesive strength of the black layer 25A and consequently can increase the long-term reliability of the backside protective sheet 20.

The above black adhesive composition preferably includes a solvent component in order to achieve suitable coating properties and ease of handling. The solvent component may be the same as that included in the transparent adhesive composition used for forming the fourth layer 26 described above.

The above-described black adhesive composition is applied to or deposited on the first layer 21 and/or the second layer 22 and then cured by drying to form a black layer 25A. Examples of the application method include a coating method, such as roll coating, gravure roll coating, or kiss coating, and a printing method. The amount of the black adhesive composition applied is preferably 3 g/m$^2$ or more and 7 g/m$^2$ or less. The thickness of the black layer 25A is preferably 2.0 μm or more and 10 μm or less and is further preferably 3.0 μm or more and 6.0 μm or less. Limiting the thickness of the black layer 25A to 2.0 μm or more enables the adhesive strength between the first layer 21 and the second layer 22 to be maintained. Limiting the thickness of the black layer 25A to 10 μm or less enables the black layer 25A to transmit near-infrared light with efficiency.

[Third Layer]

The third layer 23 may increase the adhesive property between the backside encapsulant layer 14, which is composed of an ethylene-vinyl acetate alcohol copolymer resin (EVA resin) or a polyolefin, such as a polyethylene, and the backside protective sheet 20. The structure of the third layer 23 may be substantially the same as in the first embodiment described above.

[Method for Producing Backside Protective Sheet for Solar Cell Modules]

The backside protective sheet 20 can be produced by interposing the fourth layer 26 between the first layer 21 and the second layer 22 and the black layer 25A between the second layer 22 and the third layer 23 and subsequently subjecting the above layers to a dry lamination process.

[Action of Embodiment]

The action of this embodiment having the above-described structure is described below.

As illustrated in FIG. 1, incident light L1 is incident onto the light-receiving surface of the solar cell module 10 according to the embodiment. Part of the incident light L1 subsequently passes through the transparent frontside substrate 11 and the frontside encapsulant layer 12 and then reaches the solar cell element 13. Consequently, the solar cell element 13 generates electric power.

Since most of the encapsulants commonly used for producing the solar cell module 10 are transparent or semi-transparent, when the solar cell module 10 is viewed from the transparent frontside substrate 11-side, the color of the black layer 25A can be seen through the third layer 23 and the second layer 22 at the positions of gaps in which the solar cell element 13 is not disposed. In many cases, the surface of the solar cell element 13 is black. In particular, most of the thin-film solar cell elements, which have been in increasing demand in recent years, have a black surface. Since the black layer 25A included in the backside protective sheet 20 according to this embodiment is black, most of the solar cell modules 10 and, in particular, thin-film solar cell modules 10 including thin-film solar cell elements are allowed to have a black appearance as a whole with no color unevenness, which is preferable in terms of graphical design function.

While the above solar cell module 10 is used, the temperature of the backside protective sheet 20 may be locally increased to a high temperature (e.g., 100° C. or more) as a result of the solar cell module 10 being heated by direct sunlight or the like. It was found that, in particular, in the case where a perylene pigment is used as a black pigment, a phenomenon (migration) in which the black pigment included in the black layer 25A migrates into the adjacent layers is likely to occur when the temperature of the backside protective sheet 20 is increased to a high temperature.

If the migration occurs, the graphical design function of the backside protective sheet 20 may become degraded as a whole. Furthermore, if the migration has reached the backside encapsulant layer-side, the output of the solar cell module 10 may be reduced.

In this respect, in this embodiment, the black layer 25A is interposed between the second layer 22 configured to transmit visible light and the third layer 23 configured to transmit visible light. Therefore, even if the migration of the black pigment included in the black layer 25A occurs, the black pigment particles migrated into the second layer 22 and the third layer 23 remain inside the second layer 22 and the third layer 23 (see FIG. 6). This suppresses the black pigment from reaching the backside encapsulant layer 14 (the light-receiving surface-side) or the first layer 21 (the side opposite to the light-receiving surface-side). In such a case, since the second layer 22 and the third layer 23 transmit visible light, the color of the black pigment particles migrated in the third layer 23 and the second layer 22 can be visually recognized as well as the color of the black layer 25A when viewed from the light-receiving surface-side. This suppresses the change in the degree of blackness of the appearance of the backside protective sheet 20 and consequently limits the degradation of the graphical design function of the backside protective sheet 20 as a whole. Furthermore, the risk of the black pigment passing through the third layer 23 and reaching the backside encapsulant layer 14 is eliminated. This limits the reduction in the output of the solar cell module 10 which may be caused by the negative impacts of the black pigment.

As described above, according to this embodiment, the black layer 25A including a perylene pigment is interposed between the second layer 22 configured to transmit visible light and the third layer 23 configured to transmit visible light. This can minimize the negative impacts of the migration of the black pigment included in the black layer 25A and limit a change in the color tone of the backside protective sheet 20 as a whole.

Thus, according to this embodiment, the backside protective sheet 20 for solar cell modules and the solar cell module 10 that are capable of reducing the negative impacts of the migration can be provided.

According to this embodiment, the black layer 25A is a black adhesive layer. This enables the second layer 22 and the third layer 23 to be bonded to each other with the black layer 25A.

According to this embodiment, the fourth layer 26 configured to transmit near-infrared light and visible light is interposed between the first layer 21 and the second layer 22. This allows near-infrared light to pass through the fourth layer 26 toward the first layer 21, can increase the efficiency with which the first layer 21 reflects near-infrared light, and consequently contribute to an increase in the power generation efficiency of the solar cell module 10. In addition, even if the black pigment has reached the fourth layer 26 due to the migration, the color of the black pigment migrated into the fourth layer 26 can be visually recognized when viewed from the light-receiving surface-side and, consequently, a change in the color tone of the appearance of the backside protective sheet 20 can be limited.

According to this embodiment, the fourth layer 26 is a transparent adhesive layer. This enables the first layer 21 and the second layer 22 to be bonded to each other with the fourth layer 26.

[Modification Example of Backside Protective Sheet for Solar Cell Modules]

Although the above embodiment is described taking, as an example, the case where the second layer 22 is interposed directly between the fourth layer 26 and the black layer 25A, the above embodiment is not limited to this. For example, another intermediate layer may be interposed between the fourth layer 26 and the black layer 25A in addition to the second layer 22. In such a case, the other intermediate layer is preferably configured to transmit near-infrared light and visible light.

Figure 7:
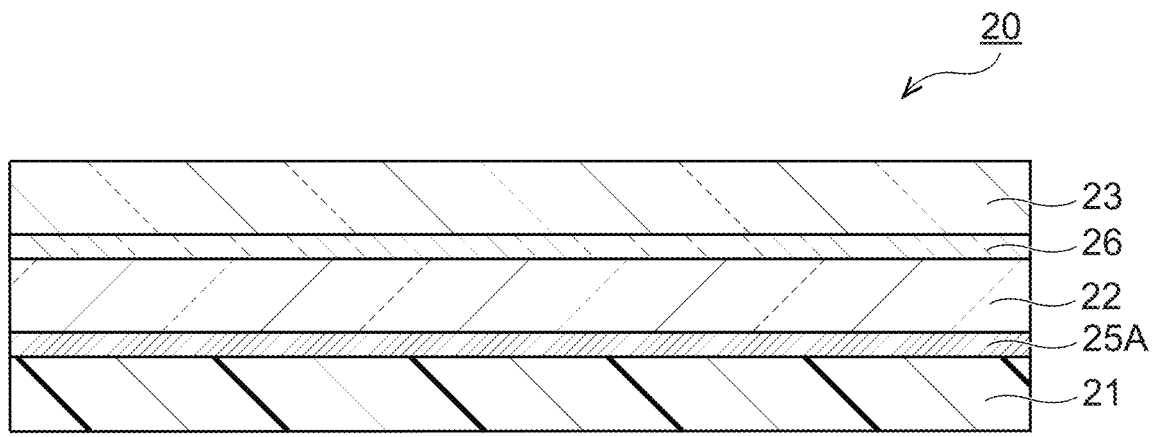
FIG. 7 is a schematic sectional view of a backside protective sheet for solar cell modules according to a modification example of the second embodiment, illustrating the structure of the layers constituting the backside protective sheet.

Although the above embodiment is described taking, as an example, the case where the black layer 25A is interposed between the second layer 22 and the third layer 23, the above embodiment is not limited to this. As illustrated in FIG. 7, the black layer 25A may be interposed between the first layer 21 and the second layer 22. In such a case, the fourth layer 26 may be interposed between the second layer 22 and the third layer 23. Interposing the black layer 25A between the first layer 21 and the second layer 22 can suppress the black pigment from migrating toward the backside encapsulant layer 14 by the migration with further certainty. In FIG. 7, another intermediate layer may be interposed between the black layer 25A and the first layer 21 in order to suppress the migration toward the first layer 21. In such a case, the other intermediate layer is preferably configured to transmit near-infrared light and visible light.

Figure 8:
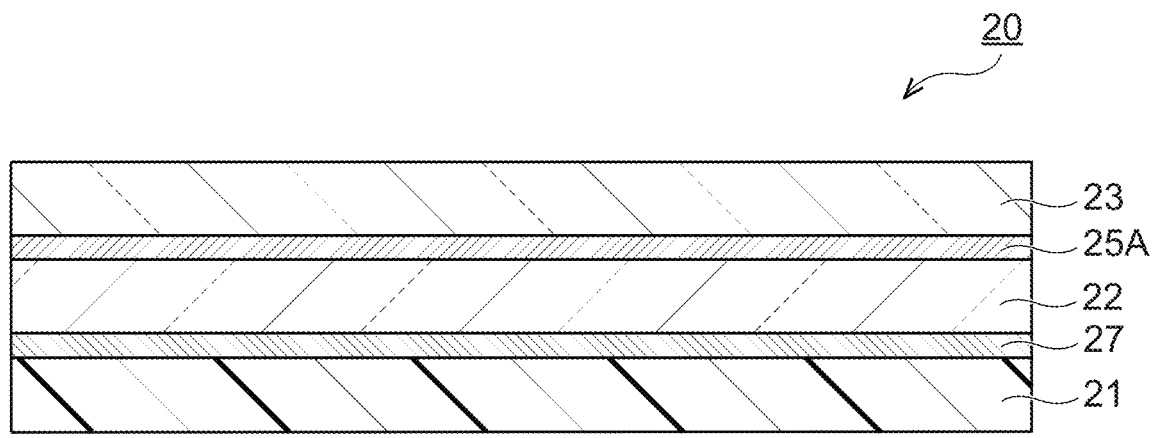
FIG. 8 is a schematic sectional view of a backside protective sheet for solar cell modules according to a modification example of the second embodiment, illustrating the structure of the layers constituting the backside protective sheet.

Although the above embodiment is described taking, as an example, the case where the backside protective sheet 20 includes one black layer (the black layer 25A), the above embodiment is not limited to this. The backside protective sheet 20 may include two black layers. For example, as illustrated in FIG. 8, an additional black layer 27 may be interposed between the first layer 21 and the second layer 22 instead of the fourth layer 26. In such a case, the additional black layer 27 may be a black adhesive layer that bonds the first layer 21 and the second layer 22 to each other. The additional black layer 27 may have the same structure as the black layer 25A. Since the backside protective sheet 20 includes two black layers (the black layer 25A and the additional black layer 27), the degree of color unevenness that occurs in the backside protective sheet 20 can be reduced as a whole by superimposing the two layers, that is, the black layer 25A and the additional black layer 27, on each other even in the case where color unevenness has occurred in each of the black layer 25A and the additional black layer 27 and, consequently, the black backside protective sheet 20 suitable in terms of graphical design function can be provided. Moreover, even in the case where the contents of the black pigment in the black layer 25A and the additional black layer 27 are reduced to low levels, the backside protective sheet 20 can achieve a sufficiently high density of black as a whole. In the case where the contents of the black pigment in the black layer 25A and the additional black layer 27 are reduced to low levels, the occurrence of diffusion due to concentration gradient is reduced and, as a result, the migration of the black pigment can be reduced. In FIG. 8, another intermediate layer may be interposed between the additional black layer 27 and the first layer 21 in order to suppress the migration toward the first layer 21. In such a case, the other intermediate layer is preferably configured to transmit near-infrared light and visible light.

Although the above embodiment is described taking, as an example, the case where the fourth layer 26, the black layer 25A, and the additional black layer 27 are adhesive layers, the above embodiment is not limited to this. At least one of the fourth layer 26, the black layer 25A, and the additional black layer 27 may be a non-adhesive layer that is not an adhesive layer. In such a case, the non-adhesive layer may include, for example, a film composed of a polyolefin resin, such as a polyethylene resin or a polypropylene resin, a polyethylene terephthalate (PET) resin, or the like. In the case where the black layer 25A or the additional black layer 27 is a non-adhesive layer, the black layer 25A or the additional black layer 27 may be a black resin layer prepared by adding a black pigment to the above film. Although the above embodiment is described taking, as an example, the case where the black layer includes a black pigment, the above embodiment is not limited to this. Black or any color other than black may be produced by using one or more types of pigments other than a black pigment.

Although the above embodiment is described taking, as an example, the case where black layers (the black layer 25A and the additional black layer 27) are used, the above embodiment is not limited to this. A colored layer may be used instead of a black layer. The colored layer may be an adhesive layer that has been colored (colored adhesive layer). The color of the colored layer is not limited to black and may be, for example, a dark color close to black. Examples of the dark color close to black include bluish purple, purplish red, and gray. The color of the colored layer is not limited to dark colors; the colored layer may be colored in a desired color in order to impart graphical design function to the backside protective sheet 20.

Examples

Specific examples of the above embodiment are described below.
(Preparation of Backside Protective Sheet)
Backside protective sheets of Example and Comparative example were prepared in the following manner.

Example

A backside protective sheet having the structure illustrated in FIG. 4 was prepared. First, second, and third layers were prepared first. The first layer was a hydrolysis-resistant white PET film having a thickness of 50 μm, which included titanium oxide. The second layer was a transparent PET film having a thickness of 125 μm. The third layer was a transparent LDPE film having a thickness of 60 μm. Subsequently, a transparent fourth layer was interposed between the first and second layers and a black layer was interposed between the second and third layers. The above layers were subjected to a dry lamination process to form a backside protective sheet. The black layer was composed of a mixture of a urethane resin serving as a principal component with a perylene black pigment. The content of the perylene black pigment in the black layer was 20% by mass. The fourth layer was the same as the black layer, except that the fourth layer did not include a black pigment unlike the black layer. The thicknesses of the fourth layer and the black layer were each 4.5 μm.

Comparative Example

A backside protective sheet of Comparative example was prepared as in Example, except that the second layer and fourth layer were omitted. That is, the backside protective sheet according to Comparative example had a three-layer structure constituted by the first layer, the black layer disposed on the first layer, and the third layer disposed on the black layer.

The backside protective sheets prepared in Example and Comparative example were heated at 150° C. for 48 hours in order to cause the migration of the black pigment included in the black layer.

Subsequently, the first layer was observed from the side opposite to the light-receiving surface-side. The results of the observation confirmed that the first layer of the backside protective sheet prepared in Example maintained its original color (white). In contrast, the first layer of the backside protective sheet prepared in Comparative example turned to light purple, because the black pigment had migrated into the first layer as a result of migration.

A plurality of elements disclosed in the foregoing embodiments and modification examples may be combined with one another as needed. Alternatively, some of the elements described in the foregoing embodiments and modification examples may be eliminated.

The invention claimed is:

1. A backside protective sheet for solar cell modules, the backside protective sheet comprising:
    a first layer configured to reflect near-infrared light;
    a first colored adhesive layer closer to a light-receiving surface than the first layer, the first colored adhesive layer being configured to transmit near-infrared light and including urethane material;
    a second colored adhesive layer closer to the light-receiving surface than the first colored adhesive layer, the second colored adhesive layer being configured to transmit near-infrared light and including urethane material;
    a second layer between the first colored adhesive layer and the second colored adhesive layer, the second layer being configured to transmit near-infrared light and visible light; and
    a third layer closer to the light-receiving surface than the second colored adhesive layer, the third layer being configured to transmit near-infrared light and visible light.

2. The backside protective sheet for solar cell modules according to claim 1, wherein the second layer has a haze value of 4% or more and 10% or less.

3. The backside protective sheet for solar cell modules according to claim 1, wherein at least one of the first colored adhesive layer and the second colored adhesive layer includes a perylene color pigment.

4. The backside protective sheet for solar cell modules according to claim 1, wherein at least one of the first colored adhesive layer and the second colored adhesive layer includes a color pigment such that a content of the color pigment in the at least one of the first colored adhesive layer and the second colored adhesive layer is 5% by mass or more and less than 10% by mass.

5. A solar cell module comprising the backside protective sheet for solar cell modules according to claim 1.

* * * * *